United States Patent
Russell et al.

(10) Patent No.: US 6,406,984 B1
(45) Date of Patent: Jun. 18, 2002

(54) METHOD OF MAKING IMPROVED ELECTRICAL CONTACT TO POROUS SILICON USING INTERCALATED CONDUCTIVE MATERIALS

(75) Inventors: Stephen D. Russell, San Diego; Michael J. Winton, Oakland, both of CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 08/944,123

(22) Filed: Oct. 6, 1997

(51) Int. Cl.[7] .......................... H01L 21/44; H01L 21/00
(52) U.S. Cl. ........................................ 438/572; 438/22
(58) Field of Search .................... 438/597, 705, 438/753, 960, 962, 21–23, 34, 409, 522, 523, 530, 533, 534, 535; 257/82, 84, 103

(56) References Cited

U.S. PATENT DOCUMENTS

| | | | |
|---|---|---|---|
| 4,990,988 A | * 2/1991 | Lin | 257/215 |
| 5,077,153 A | 12/1991 | Grange-Cossou et al. | |
| 5,118,362 A | 6/1992 | St. Angelo et al. | |
| 5,279,887 A | 1/1994 | Brady et al. | |
| 5,331,180 A | 7/1994 | Yamada et al. | |
| 5,360,759 A | 11/1994 | Stengl et al. | |
| 5,369,300 A | 11/1994 | Heideman et al. | |
| 5,427,977 A | * 6/1995 | Yamada et al. | 438/22 |
| 5,440,173 A | 8/1995 | Evans, Jr. et al. | |
| 5,554,550 A | 9/1996 | Yang | |
| 5,567,954 A | 10/1996 | Dobson et al. | |
| 5,739,565 A | * 4/1998 | Nakamura et al. | 257/301 |
| 5,834,378 A | * 11/1998 | Kurtz et al. | 438/694 |
| 5,908,303 A | * 6/1999 | Chung | 438/45 |
| 5,914,183 A | * 6/1999 | Canhan | 428/312.6 |
| 6,017,811 A | * 1/2000 | Winton et al. | 438/597 |

FOREIGN PATENT DOCUMENTS

JP          406268260 A  *  9/1994  ........... H01L/33/00

OTHER PUBLICATIONS

Tompa et al., UV–Visible–IR Electroluminescence From Si and Ge Nanocrystals in Wider Bandgap Matrix, Mat. Res. Symp.—Materials Research Society, vol. 358. pp. 701–706, 1995.*

Steiner et al., Depositing Metals into Porous Silicon the Impact on Luminescence, Mat. Res. Symp.—Materials Research Society, vol. 358. pp. 665–670, 1995.*

(List continued on next page.)

Primary Examiner—Trung Dang
Assistant Examiner—Brook Kebede
(74) Attorney, Agent, or Firm—Harvey Fendelman; Michael A. Kagan; Peter A. Lipovsky

(57) ABSTRACT

This invention describes an improved method of making electrical contact to porous silicon using intercalated conductive materials. The intercalation process may use gaseous, liquid or solid components to form conductive contacts to the silicon structures of the porous silicon. The intensity of the light emitted by porous silicon layers and devices can therefore be increased by the improved electrical interconnection between the mechanically, chemically and thermally fragile porous silicon and the device electrodes. The intercalation process uses conductive materials that interpenetrate the structures of the porous silicon thereby providing the improved electrical properties. Increasing the surface area over which electrical contact is made increases the junction area which allows increased electrical current flow across the junction. The increased electrical current flow across the junction provides an increased number of electrical charge carriers undergoing radiative recombination. Increased device efficiency is therefore provided as the number of emitted photons (corresponding to the optical brightness of the device) is proportional to the electrical charge carriers undergoing radiative recombination.

30 Claims, 4 Drawing Sheets-

OTHER PUBLICATIONS

Steiner et al., Fabrication and Performance of Electroluminescent Porous Silicon Devices, Proc. Electrochem. Soc.—Advanced Kuminescent Materials 95–25, pp. 48–57, 1996.*

Maruska et al., "Current injection mechanism for porous–silicon transparent surface light–emitting diodes", *Appl. Phys. Lett.*, 61 (11), Sep. 14, 1992, pp. 1337–1340.

Fathauer et al., "Visible luminescence from silicon wafers subjected to stain etches", *Appl. Phys. Lett.*, 60 (8), Feb. 24, 1992, pp. 995–997.

Lauerhaas et al., "Reversible Luminescence Quenching of Porous Si by Solvents", J. Am. Chem. Soc., 114, 1992, pp. 1911–1912.

Hou et al., "Large blue shift of light emitting porous silicon by boiling water treatment", *Appl. Phys. Lett.*, 62 (10), Mar. 8, 1993, pp. 1097–1098.

Shih et al., "Control of porous Si Photoluminescence through dry oxidation", *Appl. Phys. Lett.*, 60 (5), Feb. 3, 1992, pp. 633–635.

Dubbelday et al., "Photoluminescent thin–film porous silicon on sapphire", *Appl. Phys. Lett.*, 62 (14), Apr. 5, 1993, pp. 1694–1696.

Sarathy et al., "Demonstration of photoluminescence in nonanodized silicon", *Appl. Phys. Lett.*, 60 (13), Mar. 30, 1992, pp. 1532–1534.

Koshida et al., "Visible electroluminescence from porous silicon", *Appl. Phys. Lett.*, 60 (3), Jan. 20, 1992, pp. 347–349.

Cullis et al., "Visible light emission due to quantum size effects in highly porous crystalline silicon", *Nature*, vol. 353, Sep. 26, 1991, pp. 335–338.

Canham, "Silicon quantum wire array fabrication by electrochemical and chemical dissolution of wafers", *Appl. Phys. Lett.*, 57 (10), Sep. 3, 1990, pp. 1046–1048.

Fauchet et al., "Progress in the Development of Porous Silicon Light Emitters", 1995 Electronic Materials Conference, Technical Program with Abstracts, Jun. 21, 1995, p. A51.

Otto et al., "Highly Transparent and Conducting Polypyrrole–Poly(vinyl alcohol) Composite Films Prepared by Gas State Polymerization", *Polymer Journal*, vol. 18, No. 1, 1986, pp. 95–98.

Han et al., "Highly electrically conducting polymer blends", *Synthetic Metals*, 45, 1991, pp. 261–264.

Steiner et al., "New Results on Electroluminescence from Porous Silicon", Mat. Res. Soc. Symp. Proc., vol. 283, 1993, pp. 343–351.

* cited by examiner

METHOD OF MAKING IMPROVED ELECTRICAL CONTACT TO POROUS SILICON USING INTERCALATED CONDUCTIVE MATERIALS

CROSS REFERENCE TO RELATED PATENT APPLICATION

This invention is related to the co-pending patent application titled "Photonic Silicon on a Transparent Substrate" by S. D. Russell et al., United States Patent and Trademark Office Ser. No. 08/118,900 filed Sep. 9, 1993 and is related to the co-pending patent application titled "Method for Making Improved Electrical Contact to Porous Silicon" filed by the same co-inventors of the present invention. Both of these patent applications are incorporated by reference herein.

BACKGROUND OF THE INVENTION

This invention pertains broadly to the field of the semiconductor arts, and more particularly to the field of photonic porous silicon.

The band gap structure for single crystal silicon exhibits a conduction band minimum which does not have the same crystal momentum as the valence band maximum, yielding an indirect bad gap. Therefore, in silicon, radiative recombination can only take place with the assistance of a photon, making such transitions inefficient. This has prevented silicon from being used as a solid state source of light, unlike group III-V semiconductors which have a direct gap at the center of the Brillouin zone. A review of these materials properties can be found in S. M. Sze, *Physics of Semiconductor Devices,* 2nd. Edition (New York: John Wiley & Sons, 1981).

The discovery of photoluminescence in porous silicon has therefore generated a new optoelectronic material for study. A selected review of the fabrication techniques and properties of porous silicon can be found in the articles titled: "Silicon quantum wire array fabrication by electrochemical and chemical dissolution of wafers" by L. T. Canham, Appl. Phys. Lett., 57, 1046 (1990); "Visible light emission due to quantum size effects in highly porous crystalline silicon" by A. G. Cullis et al., Nature, 353, 335 (1991); "Visible luminescence from silicon wafers subjected to stain etches" by R. W. Fathauer et al., Appl. Phys. Lett., 60, 995 (1992); "Demonstration of photoluminescence in nonanodized silicon" by J. Sarathy et al., Appl. Phys. Lett., 60, 1532 (1992): and "Photoluminescent thin-film porous silicon on sapphire", by W. B. Dubbelday et al., Appl. Phys. Lett., 62, 1694 (1993).

Porous silicon can be formed, for example, by using electrochemical etching, photochemical etching or stain etching of either pure silicon substrates or of the silicon of silicon on transparent substrates (e.g. silicon-on-sapphire or silicon-on-quartz) as described in the above references and the cited co-pending patent application Ser. No. 08/118,900 of Russell et al. Such techniques can produce porous silicon typically containing mechanically fragile structures on the order of approximately 5 nm or less in size. Other materials such as germanium, silicon-germanium alloys and the like may also be etched into porous form. The utilized materials may be suitably patterned lithographically prior to the etch to define device structures or to confine the region desired to be exposed to the etch solution.

In FIG. 1, a scanning electron micrograph of electrochemically prepared porous silicon is shown. This porous silicon was prepared, as is commonly practiced in the art, by electrochemical dissolution of silicon in a solution of 48% hydrofluoric acid and 95% ethyl alcohol in a ratio of about 1:1 with a current flow in the range of about 0.1 to 10 mA/cm$^2$. FIG. 1 depicts the typical resulting structure of this process, showing dendritic-like silicon structures (lighter regions) surrounded by a large density of voids (darker regions), i.e. a porosity of greater than about 75%. The silicon structures shown in FIG. 1 also have similar structures on a smaller length scale, dimensions of approximately less than 10 nm, not observable by the scanning electron micrograph technique.

The photonic (light-emitting) properties of the porous silicon have been attributed to these smaller structures. Further details on the formation of these silicon structures and their light emitting properties are contained in the cited co-pending U.S. patent application by S. D. Russell et al., titled "Photonic Silicon on a Transparent Substrate" United States Patent and Trademark Office Ser. No. 08/118,900 incorporated herein by reference.

The typical emission spectrum of porous silicon is in the red, orange and yellow region, i.e. 500 to 750 nm, although green and blue emissions have also been demonstrated. Blue shift of the peak emission wavelength has been shown by increased oxidation and etching of the porous silicon as described in "Control of porous Si photoluminescence through dry oxidation" by S. Shih et al., Appl. Phys. Lett., 60, 833 (1992) and in "Large blue shift of light emitting porous silicon by boiling water treatment" by X. Y. Hou et al., Appl. Phys. Lett., 62, 1097 (1993).

The article titled "Reversible Luminescence Quenching of Porous Si by Solvents" by J. M. Lauerhaas et al., J. Am. Chem. Soc., 114, 1911 (1992) discloses that a reversible quenching of the photoluminescence is obtained from porous silicon fabricated in bulk silicon due to surface adsorbates. The degree of quenching nominally scales with the solvent dipole moment. Furthermore, it has been discovered that, in many cases, the quenching of the light emitting property is not reversible when porous silicon is contacted by solutions and chemical elements commonly used in semiconductor processing. These effects demonstrate that the light emission of porous silicon is chemically fragile, i.e. susceptible to being changed by a chemical element or compound. In addition, it is known that porous silicon can be thermally fragile, as the heating of the porous silicon structures and/or devices to temperatures approaching about 300° C. and above permanently destroys the light emitting (photonic) properties of the porous silicon.

At this time the light emitting mechanism is not fully understood. The scientific controversy surrounding the detailed physical mechanism behind the light emission has not, however, hindered the ability to fabricate porous silicon layers and useful light emitting devices using this technology as described in "Visible electroluminescence from porous silicon" by N. Koshida et al., Appl. Phys. Lett., 60, 347 (1992); "New Results on Electroluminescence from Porous Silicon" by P. Steiner et al., in *Microcrystalline Semiconductors: Materials Science & Devices,* Materials Research Society Proceedings, 283, 343 (1993) and in "Current injection mechanism for porous-silicon transparent surface light-emitting diodes" by H. P. Maruska et al., Appl. Phys. Lett. 61, 1338 (1992).

The abstract titled "Progress in the Development of Porous Silicon Light Emitters" by P. M. Fauchet et al., 1995 Electronic Materials Conference, Technical Program with Abstracts, page A51, Jun. 21, 1995, notes, that the efficiency for porous silicon light-emitting diodes remains low "due to the difficulty in making solid state contacts to a highly porous structure".

It is known to use evaporated or sputter-deposited layers of semi-transparent gold or indium tin oxide (ITO) to make electrical contact to porous silicon layers and device structures. These techniques are line-of-sight deposition techniques that do not fill the irregular matrix of voids inherent of the porous silicon, due, in part, to the large particle size and the directionality of deposited material.

FIG. 2 is a cross-section of a silicon layer 10 in which is formed a porous silicon region 12 consisting of voids 14 and silicon structures 16. According to a prior art technique, porous silicon region 12 is covered by an electron beam sputtered conducting layer 18 of a conductive metal such as indium-tin-oxide (typically 95% indium oxide, 5% tin oxide). As can be seen, conductive metal 18 does not fill voids 14 of porous silicon region 12, preventing efficient electrical contact between conducting metal 18 and silicon structures 16.

In U.S. Pat. No. 5,331,180, titled "Porous Semiconductor Light Emitting Device", M. Yamada et al. teaches the use of a conductive polymer layer as a means to make electrical contact to porous silicon or porous silicon-carbide structures and to mechanically support the fragile porous silicon. In Yamada et al's embodiment, the conductive polymer layer binds to the top surface of the porous silicon as well as the "upper regions" of the pores or voids of the porous silicon, however the polymer conductor is not flowed to substantially fill these voids.

While prior art techniques of making electrical contact to porous silicon are known to exist, improving the efficiency of these contacts is a desired goal.

Alternative techniques are therefore desired to make electrical contact to the mechanically, chemically and thermally fragile porous structures in such a manner as to preserve and enhance their photonic properties.

SUMMARY OF THE INVENTION

The invention is a method of making improved electrical contact to porous photonic materials, such as porous silicon, using conductive materials that interpenetrate the porous materials without damaging their photonic properties. This intercalation process may use gaseous, liquid or solid components to form extensive conductive contacts to the structures of the porous materials to thereby enhance or promote their photonic characteristics. The improved electrical interconnection between the mechanically, chemically and thermally fragile porous materials and device electrodes will allow an increase in the intensity of the light emitted by the photonic structures of the porous materials.

An object of this invention is to improve electrical contact to porous photonic materials.

Another object of this invention is to improve electrical contact to porous silicon.

Another object of this invention is to make electrical contact to porous silicon using gaseous, liquid or solid components.

Another object of this invention is to make electrical contact to porous silicon without mechanically damaging the light-emitting (photonic) properties of the porous silicon.

Another object of this invention is to make electrical contact to porous silicon without chemically damaging the light emitting (photonic) properties of the porous silicon.

Yet another object of this invention is to make electrical contact to porous silicon without thermally damaging the light emitting (photonic) properties of the porous silicon.

Another object of this invention is to make electrical contact to porous silicon using intercalated conductive materials.

Yet another object of this invention is to make electrical contact to porous silicon using conductive materials that interpenetrate the silicon structures of porous silicon to improve electrical contact to these structures.

These and other objects of the invention will become more readily apparent from the following specification and claims when taken in conjunction with the appended drawings.

DESCRIPTION OF THE PREFERRED EMBODIMENT

The invention is a method of making improved electrical contact to porous photonic materials, such as porous silicon, using conductive materials that interpenetrate the structures of these porous materials without damaging their photonic properties. This intercalation process may use gaseous, liquid or solid components to form extensive conductive contacts to these structures to thereby enhance or promote their photonic characteristics. Increasing the surface area over which electrical contact is made with the photonic structures will increase their electrical junction area, allowing increased electrical current flow across the junction. The increased electrical current flow will increase the number of electrical charge carriers undergoing radiative recombination within the structures. Increased device efficiency is therefore provided since the number of emitted photons (corresponding to the optical brightness of the porous material) is proportional to the number of electrical charge carriers undergoing radiative recombination. The intensity of the photonic emission by porous layers and devices can therefore be increased by the improved electrical interconnection between the mechanically, chemically and thermally fragile porous materials and device electrodes.

Figure 1:
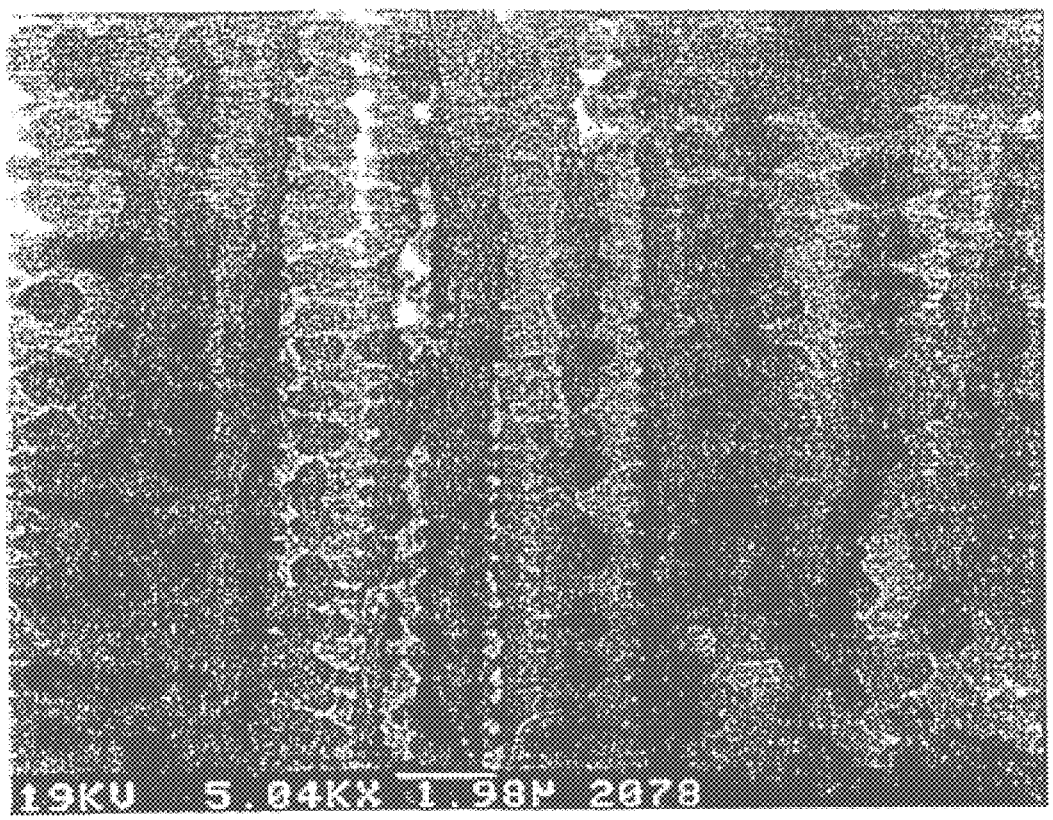
FIG. 1 shows a scanning electron micrograph of electrochemically prepared porous silicon.
Figure 2:
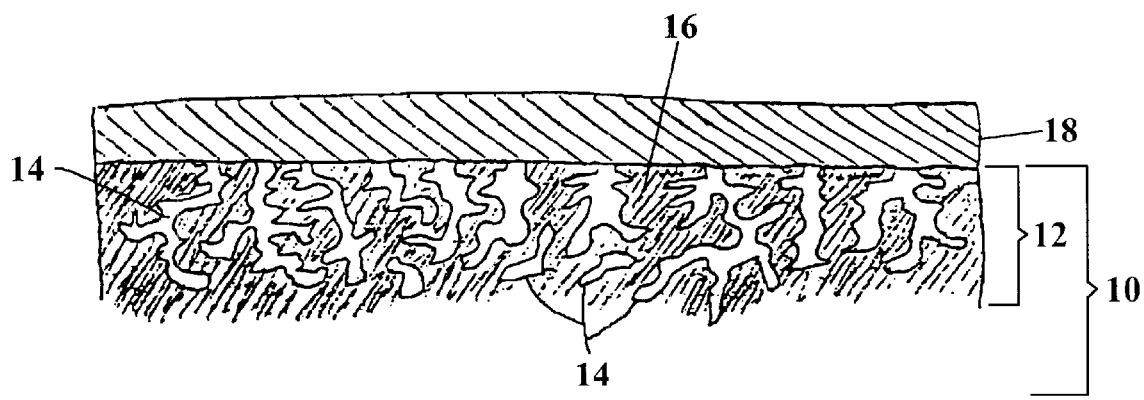
FIG. 2 is a cross-section of porous silicon and a conducting layer applied according to the prior art.
Figure 3:
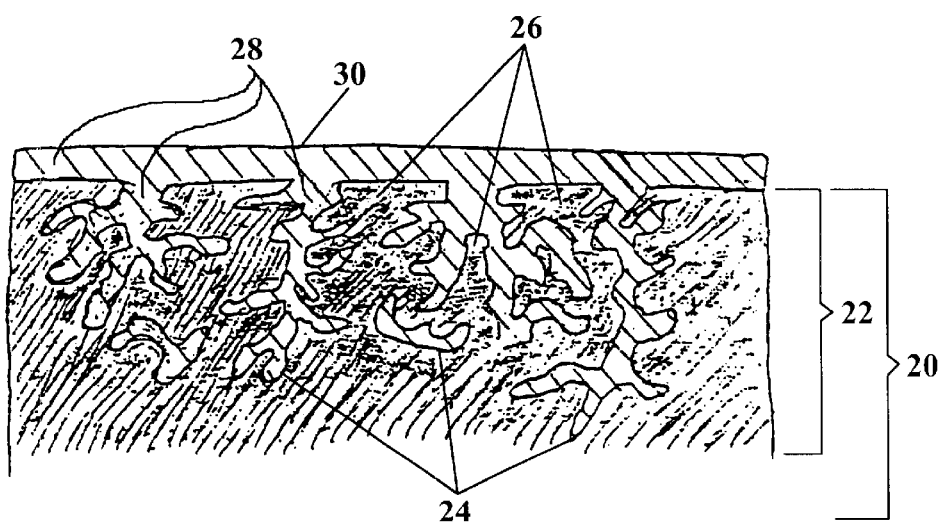
FIG. 3 is a schematic representation of porous silicon and an electrical conductor applied according to the invention.

FIG. 3 schematically shows porous silicon to which electrical contact has been made according to one embodiment of the invention. Silicon layer 20 includes porous silicon region 22 that includes voids 24 therein and remaining silicon structures 26. These silicon structures are like those discussed in regard to FIG. 1, in which at least some of these structures are of suitable dimensions to have photonic properties. Porous silicon region 22 is shown covered by a conductive metal 28 through use of an intercalation process according to the invention. According to this process, voids 24 can be substantially filled with conductive metal 28 to allow effective electrical contact between conductive metal 28 and the surfaces of silicon structures 26. It should be noted that in this schematic cross-sectional view, some voids 24 filled with conductive metal layer 28 appear not to be electrically or physically coupled with upper region 30 of conductive metal layer 28, while in practice such voids will be electrically or physically coupled to this region via paths out of the plane of the paper. In the preferred embodiment, layer 20 and porous region 22 are of silicon, though other materials such as germanium, silicon-germanium alloys and the like may also be made into porous form. Improved electrical contact with porous region 22 is obtained by at least partially filling voids 24, which enables enhanced surface contact to the material (silicon) structures 26. The conductive metal used may then be patterned or unpatterned as desired for the job at hand. Similarly, the material layer may be patterned to leave regions of higher and lower porosity in the material as desired.

The herein disclosed inventive intercalation process may use gaseous, liquid or solid components to form conductive contacts to porous materials. In the preferred embodiment, a solid conductive metal with low melting point is used in the intercalation process. For example, indium may be deposited by using techniques of sputtering, evaporation, mechanical transfer and the like to form an indium-porous silicon bilayered structure. This bilayered structure is then heated, using for example a furnace or a hot plate, to a temperature exceeding approximately the melting point of indium (about 156° C.) but not exceeding the temperature known to destroy the photonic properties of porous silicon (about 300° C.). The indium will, at least partially, fill the voids in the silicon by flowing into these voids, thereby improving the electrical contact with the silicon structures of the porous silicon. Alternate solid sources for the conductive metal include: Wood's metal (50% bismuth, 10% cadmium, 13.3%tin, 26.7% lead) which melts about 70° C., gallium (melting point about 29° C.), fusible alloys and eutectics shown in Table I, and the like.

The herein disclosed inventive intercalation process may use gaseous, liquid or solid components to form conductive contacts to porous materials. In the preferred embodiment, a solid conductive metal with low melting point is used in the intercalation process. For example, indium may be deposited by using techniques of sputtering, evaporation, mechanical transfer and the like to form an indium-porous silicon bilayered structure. This bilayered structure is then heated, using for example a furnace or a hot plate, to a temperature exceeding approximately the melting point of indium (about 156° C.) but not exceeding the temperature known to destroy the photonic properties of porous silicon (about 300° C.). The indium will, at least partially, fill the voids in the silicon by flowing into these voids, thereby improving the electrical contact with the silicon structures of the porous silicon. Alternate solid sources for the conductive metal include: Wood's metal (50% bismuth, 10% cadmium, 13.3%tin, 26.7% lead) which melts at about 70° C., gallium (melting point about 29° C.), fusible alloys and eutectics shown in Table I, and the like.

TABLE I

Examples of Fusible Alloys and Eutectics

| SYSTEM | COMPOSITION | EUTECTIC TEMPERATURE (° C.) |
|---|---|---|
| Cd—Bi | 40:60 | 144 |
| In—Bi | 66.3:33.7 | 72 |
|  | 33:67 | 109 |
| Pb—Bi | 43.5:56.5 | 125 |
| Sn—Bi | 42:58 | 139 |
| Pb—Sn—Bi | 32:16:52 | 96 |
| Pb—Cd—Bi | 40:8:52 | 92 |
| Sn—Cd—Bi | 26:20:54 | 102 |
| In—Sn—Bi | 25:17:58 | 79 |

TABLE I-continued

Examples of Fusible Alloys and Eutectics

| SYSTEM | COMPOSITION | EUTECTIC TEMPERATURE (° C.) |
|---|---|---|
| Pb—Sn—Cd—Bi | 26.7:13.3:10:50 | 70 |
| In—Pb—Sn—Bi | 21:18:11.6:49.4 | 57 |
| In—Cd—Pb—Sn—Bi | 19.1:5.3:22.6:8.3:44.7 | 47 |

Alternative methods of heating include optical illumination by a continuous wave or pulsed light or laser source, use of a rapid thermal annealing source, acoustical heating using for example ultrasonic agitation, or inductive heating. Modifications of the time-temperature matrix to accommodate the alternative methods may be experimentally obtained by those skilled in the art of thermal treatments.

Figure 4:
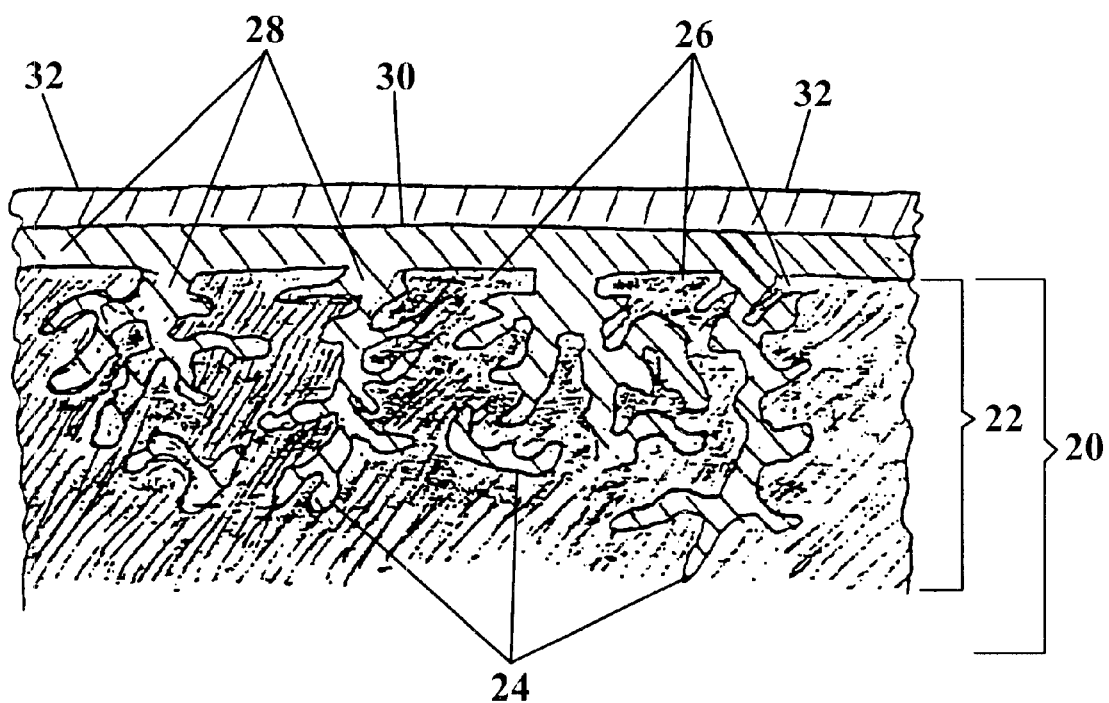
FIG. 4 is a schematic representation of porous silicon and an electrical conductor applied according to another embodiment of the invention.

In addition to the bilayered structure described above, additional layers may be appropriately configured on the porous region and appropriately heated in a manner to effect the intercalation process and provide for improved electrical contact to this region. FIG. 4 illustrates additional layer usage. As can be seen, additional conductive layer 32 is disposed on upper region 30 of conductive metal layer 28 by techniques known in the art, including but not limited to sputter deposition, evaporation, spin-casting and misted-sourced deposition. Conductive layer 32 may be employed to reduce the contact resistance, planarize the electrode surface, act as a barrier layer, passivate or encapsulate the underlying surface.

An alternate embodiment uses a liquid conductive metal for the intercalation process. First, a porous region, of silicon, for example, is formed using techniques well known in the art. Then, a liquid conductive metal such as an indium-gallium eutectic composed of 24% indium and 76% gallium is deposited by using techniques such as pouring, spin casting, mechanical transfer and the like to form an indium/gallium-porous silicon bilayered structure. The indium/gallium conductive metal is liquid at typical ambient or room temperatures and can be used to at least partially fill, including substantially fill, the voids in the porous silicon thereby improving electrical contact with the structures of the porous silicon. The bilayered structure may then be heated if desired, using for example a furnace or a hot plate, to further increase the intercalation process but not heated to temperatures exceeding the temperature that destroys the photonic properties of porous silicon (about 300° C.). Alternative methods of heating include optical illumination by a continuous wave or pulsed light or laser source, use of a rapid thermal annealing source, acoustic or inductive heating. Modifications of the time-temperature matrix to accommodate the alternative methods may be experimentally obtained by those skilled in the art of thermal treatments. Alternate liquid sources for the conductive metal include various indium-gallium eutectics, mercury, conducting polymers and the like.

In addition to the bilayered embodiment described above, additional layers, as shown in FIG. 4, may be appropriately configured on the porous silicon layer or region to effect the intercalation process and provide for the improved electrical contact. The multilayers may be any combination of liquid or solid, for example a conductive liquid intercalant such as an indium-gallium eutectic covered by an aluminum layer. The aluminum may then serve a dual purpose, (1) encapsulate or passivate the liquid intercalant from the remaining regions of the silicon sample or integrated circuitry, and (2)

provide a solid conductive metallization which enables patterning for interconnect metallization and electrical contact to associated devices and/or circuitry.

Yet another embodiment uses a gaseous ambient to form a conductive metal during the intercalation process. A porous region is formed in a suitable material, such as silicon, using techniques well known in the art. A metallic layer is then deposited on the porous region using diffusion of a gaseous ambient into the voids of the porous region and subsequent photolytic or pyrolytic decomposition of the ambient to provide adhesion of a metallic layer to the structures within the porous region to at least partially fill, including substantially fill, the voids in the porous region and thereby improve electrical contact with these structures. The intercalated structures may be heated if desired using, for example, a furnace or a hot plate to further increase the intercalation process but not heated to temperatures exceeding the temperature that destroys the photonic properties of porous silicon (about 300° C.). Alternative methods of heating include optical illumination by a continuous wave or pulsed light laser source, or use of a rapid thermal annealing source, acoustic or inductive heating. Modifications of the time-temperature matrix to accommodate the alternative methods may be experimentally obtained by those skilled in the art of thermal treatments. Gaseous sources that can be used to provide for a conductive metal include silane or disilane mixed with dopant sources such as phosphine or diborane, or gaseous of metal such as tungsten hexafluoride, dimethyl aluminum hydride, tri-methylaluminum (TMA), tri-isobutylaluminum (TBA), copper formate, tetrabutyl titanate, metallic carbonyls, metallic alkyls, organometallic compounds, and the like. As evident from the above list, the gaseous intercalant sources may be obtained by heating solid or liquid sources above their boiling point to obtain a volatile gaseous intercalant. Alternately, the solid or liquid sources may be atomized using for example ultrasonic stimulation to obtain physical vapor deposition of the gaseous intercalant. In addition to the bilayered embodiment described above, additional layers as shown in FIG. 4, may be appropriately configured on the porous region to effect the intercalation process and provide for improved electrical contact. The multilayers may be any combination of gaseous, liquid or solid.

While this disclosure emphasized the embodiment using porous silicon based materials, the teachings herein will allow the ability control the photoemission of other porous structures in materials such as germanium, silicon-germanium alloys, silicon carbide and other semiconductors. Variations in crystallographic structure, dopant type and density, etching and thermal treatments, and appropriate patterning of the layers and the like will also be readily apparent from the teachings herein disclosed.

Variations in the method of fabricating the porous layers can also be readily accommodated by this inventive concept. Furthermore, the detailed process flow may be modified such that this inventive process may be incorporated into the fabrication of electronic, optical and electro-optical devices as needed. Using the intercalation process described herein to simultaneously add dopants or otherwise change the composition of a material while improving the electrical contact is also envisioned within the scope of this invention.

Obviously, many modifications and variations of the invention are possible in light of the above teachings. It is therefore to be understood that within the scope of the appended claims the invention may be practiced otherwise than as specifically described.

What is claimed is:

1. A method of forming an electrical contact between a conductive layer and a porous region of a semiconductor material in which said porous region includes voids, comprising the step of: heating said conductive layer to flow into said voids wherein said heating is to a temperature no greater than about 300° C. and wherein said conductive layer has a melting point that is less than about 300° C. and is selected from the group of indium, Wood's metal, gallium, and fusible alloys.

2. A method according to claim 1 wherein said conductive layer substantially fills said voids.

3. A method according to claim 1 wherein said semiconductor material consists essentially of material selected from the group of silicon, germanium, silicon carbide, and group IV semiconductor alloys.

4. A method according to claim 1 further including providing an additional conductive layer upon said conductive layer.

5. A method according to claim 1 wherein said heating is performed through the use of one of the following: furnace heating, hot-plate heating, rapid thermal annealing, continuous wave optical illumination, pulsed optical illumination, inductive heating and acoustical heating.

6. A method according to claim 2 wherein said semiconductor material consists essentially of material selected from the group of silicon, germanium, silicon carbide, and group IV semiconductor alloys.

7. A method according to claim 2 further including providing an additional conductive layer upon said conductive layer.

8. A method according to claim 2 wherein said heating is performed through the use of one of the following: furnace heating, hot-plate heating, rapid thermal annealing, continuous wave optical illumination, pulsed optical illumination, inductive heating and acoustical heating.

9. A method of forming electrical contact to a porous region of a semiconductor material in which said porous region includes voids comprising the step of:

flowing a liquid conductor layer into said voids wherein said liquid conductive layer is liquid when at room temperature.

10. A method according to claim 9 wherein said liquid conductive layer is heated to enhance the flow of said liquid conductive layer into said voids.

11. A method according to claim 10 wherein said heating is to a temperature no greater than about 300° C.

12. A method according to claim 11 wherein said heating is performed through the use of one of the following: furnace heating, hot-plate heating, rapid thermal annealing, continuous wave optical illumination, pulsed optical illumination, inductive heating and acoustical heating.

13. A method according to claim 9 wherein said liquid conductive layer substantially fills said voids.

14. A method according to claim 13 wherein said liquid conductive layer is heated to enhance the flow of said liquid conductive layer into said voids.

15. A method according to claim 14 wherein said heating is to a temperature no greater than about 300° C.

16. A method according to claim 15 wherein said heating is performed through the use of one of the following: furnace heating, hot-plate heating, rapid thermal annealing, continuous wave optical illumination, pulsed optical illumination, inductive heating and acoustical heating.

17. A method according to claim 9 wherein said semiconductor material consists essentially of a material selected from the group of silicon, germanium, silicon carbide, and group IV semiconductor alloys.

18. A method according to claim 9 further including providing an additional conductive layer upon said liquid conductive layer.

19. A method of forming electrical contact to a porous region of a semiconductor material in which said porous region includes voids comprising the step of:

flowing a liquid conductor layer into said voids wherein said liquid conductive layer is selected from the group of indium-gallium eutectic, mercury, and conducting polymers.

20. A method of forming electrical contact to a porous region of a semiconductor material in which said porous region includes voids comprising the step of:

flowing a liquid conductor layer into said voids wherein said liquid conductive layer is heated to a temperature no greater than about 300° C. to enhance the flow of said liquid conductor into said voids and wherein said liquid conductor is selected from the group of indium-gallium eutectic, mercury, and conducting polymers.

21. A method of forming electrical contact to a porous region of a semiconductor material in which said porous region includes voids comprising the step of:

flowing a liquid conductor layer into said voids to substantially fill said voids wherein said liquid conductive layer is heated to enhance the flow of said liquid conductor into said voids and wherein said liquid conductor is selected from the group of indium-gallium eutectic, mercury, and conducting polymers.

22. A method according to claim 21 wherein said heating is performed through the use of one of the following: furnace heating, hot-plate heating, rapid thermal annealing, continuous wave optical illumination, pulsed optical illumination, inductive heating and acoustical heating.

23. A method of forming electrical contact to a porous region of a semiconductor material in which said porous region has photoluminescent properties and includes voids, comprising the steps of:

forming a conductive layer in said voids by immersing said porous region in a gaseous ambient; decomposing said gaseous ambient to deposit said conductive layer on said porous region and within said voids; and heating said conductive layer by pulsed optical illumination to a temperature no greater than about 300° C. to flow said conductive layer into said voids.

24. A method according to claim 23 wherein said gaseous ambient is selected from the group of tungsten hexaflouride, dimethyl aluminum hydride, trimethylaluminum (TMA), tri-isobutylaluminum (TBA), copper formate, tetrabutyl titanate, metallic carbonyls, metallic alkyls, organometric compounds, silane with a dopant source, and disilane with a dopant source.

25. A method according to claim 23 wherein said heating is further performed through the use of one of the following: furnace heating, hot-plate heating, rapid thermal annealing, continuous wave optical illumination, inductive heating and acoustical heating.

26. A method according to claim 23 wherein said conductive layer substantially fills said voids.

27. A method according to claim 26 wherein said heating is further performed through the use of one of the following: furnace heating, hot-plate heating, rapid thermal annealing, continuous wave optical illumination, inductive heating and acoustical heating.

28. A method according to claim 26 wherein said gaseous ambient is selected from the group of tungsten hexaflouride, dimethyl aluminum hydride, trimethylaluminum (TMA), tri-isobutylaluminum (TBA), copper formate, tetrabutyl titanate, metallic carbonyls, metallic alkyls, organometric compounds, silane with a dopant source, and disilane with a dopant source.

29. A method according to claim 26 wherein said semiconductor material consists essentially of a material selected from the group of silicon, germanium, silicon carbide, and group IV semiconductor alloys.

30. A method according to claim 26 further including providing an additional conductive layer upon said conductive layer.

* * * * *